(12) United States Patent
Kim et al.

(10) Patent No.: US 12,158,501 B2
(45) Date of Patent: Dec. 3, 2024

(54) MONITORING CIRCUIT, INTEGRATED CIRCUIT INCLUDING THE SAME, AND OPERATING METHOD OF MONITORING CIRCUIT

(71) Applicant: SAMSUNG ELECTRONICS CO., LTD., Suwon-si (KR)

(72) Inventors: Yongwoo Kim, Seongnam-si (KR); Sera An, Hwaseong-si (KR); Dongsuk Lee, Suwon-si (KR); Chanhui Park, Yongin-si (KR); Seunghoon Lee, Hwaseong-si (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 105 days.

(21) Appl. No.: 17/895,252

(22) Filed: Aug. 25, 2022

(65) Prior Publication Data

US 2023/0068821 A1 Mar. 2, 2023

(30) Foreign Application Priority Data

Aug. 25, 2021 (KR) .................. 10-2021-0112655

(51) Int. Cl.
*G01R 31/319* (2006.01)
*G01R 31/30* (2006.01)
*G05B 19/042* (2006.01)

(52) U.S. Cl.
CPC ... *G01R 31/31924* (2013.01); *G01R 31/3004* (2013.01); *G05B 19/0425* (2013.01)

(58) Field of Classification Search
CPC .......... G01R 31/31924; G01R 31/3004; G01R 31/2844; G01R 31/2644; G01R 31/275;

(Continued)

(56) References Cited

U.S. PATENT DOCUMENTS 3,848,188 A * 11/1974 Ardezzone ....... G01R 31/31926
714/744
4,734,673 A * 3/1988 Murata ................ G07C 5/00
340/439

(Continued)

FOREIGN PATENT DOCUMENTS

JP     2020064965 A * 4/2020 ............. G01R 29/10
KR     10-0599348 B1     7/2006

(Continued)

OTHER PUBLICATIONS

Iizuka et al., "All-Digital PMOS and NMOS Process Variability Monitor Utilizing Shared Buffer Ring and Ring Oscillator," IEICE Transactions on Electronics, vol. E95-C, No. 4, pp. 627-634, Apr. 2012, Total 9 pages.

(Continued)

*Primary Examiner* — Lee E Rodak
*Assistant Examiner* — Demetrius R Pretlow
(74) *Attorney, Agent, or Firm* — Sughrue Mion, PLLC

(57) ABSTRACT

A monitoring circuit includes a sensor circuit having a plurality of devices and a selection circuit, which selects a device to be monitored among the plurality of devices, an input circuit, which applies, based on input digital data, a first signal to the device to be monitored and an output circuit, which generates output digital data based on a second signal generated by the sensor circuit. The input circuit includes a digital-to-analog converter, and the output circuit includes an analog-to-digital converter.

20 Claims, 14 Drawing Sheets

(58) Field of Classification Search
CPC .. G01R 31/2621; G05B 19/0425; H01L 22/34
See application file for complete search history.

(56) References Cited

U.S. PATENT DOCUMENTS

| | | | |
|---|---|---|---|
| 5,790,559 A * | 8/1998 | Sato | G11C 29/44 714/720 |
| 5,844,913 A * | 12/1998 | Hassoun | G01R 31/31924 714/724 |
| 5,959,463 A * | 9/1999 | Funakura | G01R 31/3004 324/762.01 |
| 5,977,774 A * | 11/1999 | Noble | G01R 31/3004 324/73.1 |
| 6,008,683 A * | 12/1999 | Gillette | G01R 31/31924 326/34 |
| 6,255,842 B1 * | 7/2001 | Hashimoto | G01R 31/3004 324/762.02 |
| 6,480,979 B1 * | 11/2002 | Tomari | G01R 31/3193 714/724 |
| 6,498,473 B1 * | 12/2002 | Yamabe | G01R 31/31924 324/750.01 |
| 6,499,121 B1 | 12/2002 | Roy et al. | |
| 6,653,855 B2 * | 11/2003 | Mori | G01R 31/319 324/756.07 |
| 7,205,854 B2 | 4/2007 | Liu | |
| 7,403,030 B2 | 7/2008 | Walker et al. | |
| 7,484,155 B2 * | 1/2009 | Yoon | G01R 31/3167 714/712 |
| 7,630,259 B1 * | 12/2009 | Han | G11C 29/08 365/201 |
| 7,653,888 B2 | 1/2010 | Habib et al. | |
| 7,969,168 B1 * | 6/2011 | Lin | G01R 31/3167 324/73.1 |
| 8,183,910 B2 | 5/2012 | Chung et al. | |
| 8,310,265 B2 | 11/2012 | Zjajo et al. | |
| 9,444,338 B1 * | 9/2016 | Pastorina | G05F 1/10 |
| 10,823,780 B1 * | 11/2020 | Tabalujan | G01R 31/2856 |
| 2002/0070726 A1 * | 6/2002 | Sugamori | G01R 31/31921 324/762.01 |
| 2006/0038578 A1 * | 2/2006 | Hashimoto | G01R 19/10 324/762.02 |
| 2008/0025383 A1 * | 1/2008 | Li | G01R 31/31937 375/226 |
| 2008/0174335 A1 * | 7/2008 | Maekawa | G01R 31/2621 324/762.09 |
| 2009/0015221 A1 * | 1/2009 | Kodera | G01R 31/31924 323/279 |
| 2009/0167339 A1 * | 7/2009 | Marshall | G01R 31/3025 324/754.29 |
| 2010/0244847 A1 * | 9/2010 | Kudo | G01R 31/3842 324/433 |
| 2011/0099443 A1 * | 4/2011 | Ishida | G01R 31/31926 714/E11.155 |
| 2012/0161885 A1 * | 6/2012 | Saneyoshi | G01R 31/2882 331/55 |
| 2012/0163441 A1 * | 6/2012 | Lechner | G01R 31/2837 375/227 |
| 2013/0202008 A1 * | 8/2013 | Myers | G01K 7/346 374/142 |
| 2013/0307576 A1 * | 11/2013 | Ilkov | G01R 31/2621 327/564 |
| 2014/0095102 A1 * | 4/2014 | Potyrailo | G01R 27/28 324/603 |
| 2015/0091591 A1 * | 4/2015 | Charles | G01K 7/22 374/183 |
| 2015/0346241 A1 * | 12/2015 | van Dijk | G01R 19/0092 324/123 R |
| 2016/0037099 A1 * | 2/2016 | Mandelli | H01L 27/14612 348/241 |
| 2016/0139180 A1 * | 5/2016 | Meninger | G01R 31/52 324/756.01 |
| 2017/0141787 A1 * | 5/2017 | Bacchu | G01R 27/2605 |
| 2017/0146598 A1 * | 5/2017 | Kim | G11C 29/00 |
| 2017/0149423 A1 * | 5/2017 | Huang | G01R 31/2621 |
| 2019/0257881 A1 * | 8/2019 | Jan | G11C 11/161 |
| 2021/0020692 A1 * | 1/2021 | Kim | H10N 50/10 |
| 2022/0187366 A1 * | 6/2022 | Lee | H03M 1/108 |
| 2022/0206062 A1 * | 6/2022 | Oh | H03K 5/24 |
| 2023/0047664 A1 * | 2/2023 | Jeong | G01R 31/2889 |
| 2023/0288452 A1 * | 9/2023 | Mahendra | G01R 19/25 |
| 2023/0296660 A1 * | 9/2023 | Goeke | G01R 31/2601 324/609 |

FOREIGN PATENT DOCUMENTS

| | | |
|---|---|---|
| KR | 10-2009-0122268 A | 11/2009 |
| KR | 10-0939980 B1 | 2/2010 |

OTHER PUBLICATIONS

Bhushan et al., "Ring Oscillators for CMOS Process Tuning and Variability Control," IEEE Transactions on Semiconductor Manufacturing, vol. 19, No. 1, pp. 10-18, Feb. 2006.

Luo et al., "A Novel Array-Based Test Methodology for Local Process Variation Monitoring," IEEE Transactions on Semiconductor Manufacturing, vol. 24, No. 2, pp. 280-293, May 2011.

Hess et al., "Device Array Scribe Characterization Vehicle Test Chip for Ultra Fast Product Wafer Variability Monitoring," 2007 IEEE International Conference on Microelectronic Test Structures, pp. 145-149, Mar. 2007.

Agarwal et al., "Fast Characterization of Threshold Voltage Fluctuation in MOS Devices," IEEE Transactions on Semiconductor Manufacturing, vol. 21, No. 4, pp. 526-533, Nov. 2008.

* cited by examiner

MONITORING CIRCUIT, INTEGRATED CIRCUIT INCLUDING THE SAME, AND OPERATING METHOD OF MONITORING CIRCUIT

CROSS-REFERENCE TO RELATED APPLICATION

This application is based on and claims priority under 35 U.S.C. § 119 to Korean Patent Application No. 10-2021-0112655, filed on Aug. 25, 2021 in the Korean Intellectual Property Office, the disclosure of which is incorporated by reference herein in its entirety.

BACKGROUND

The inventive concept relates to a monitoring circuit, and more particularly, to a monitoring circuit including a digital-to-analog converter, an analog-to-digital converter, a current-to-voltage converter, and a device under test (DUT) for identifying characteristics of a desired device on a chip, and an operating method of the monitoring circuit.

Due to the recent miniaturization and increased complexity of semiconductor processes, the effects of process characteristics during product development has significantly increased. Moreover, because the process characteristics are not accurately measured and analyzed, device or product defects may occur. In addition, the degree of difficulty in the analysis is also increased according to the increasing degree of integration and complexity of a product, and demand for improvement of analysis capability and accuracy for the process characteristics has continuously increased. As a result, circuits monitoring various environment characteristics of a device, such as a temperature sensor, a voltage sensor, and a process sensor have been developed and mounted on the device. Data obtained by the mounted sensors is used in a wide range such as prediction and analysis of device characteristics, and determination of an overall device characteristics improvement direction including circuit and process improvement directions.

Various research are conducted into a method of identifying a process status by using the process sensor, and may include an analysis method based on digital logic characteristics and an analysis method based on analog characteristics of elements and circuits.

The analysis method based on digital logic characteristics may be embedded in a real device, and may be performed in an environment identical to the actual device and easily integrated in a real device by using a digital interface. However, the analysis method based on digital logic characteristics may lack of identifiable information except limited information about a process of a device, and in addition, may have a difficulty in an analysis of input/output devices and passive devices used in an analog circuit or the like. In addition, the analysis method based on digital logic characteristics may not individually identify various parameters of each device, and accordingly, may not accurately represent a process due to a difference between an actual process development and an analysis result.

On the other hand, the analysis method based on analog characteristics may identify various parameters of a device by directly applying a desired bias voltage to the device, and may have an advantage that the identification result is identical to an actual analysis pattern used for process development and analysis. The analyzed parameters in this manner are widely used for various analyses. However, an analysis method of an analog type used in related art systems may require a lot of pads for direct probing, and because an analog interface is used, there is a disadvantage that a large area is required with respect to a measurable device and parameters, and embedding the analysis method in a device is difficult. As a result, the analysis method is arranged at a location independent of a device, and in this case, the analysis result may not represent the actual situation.

SUMMARY

The inventive concept provides a monitoring circuit, which accurately monitors process characteristics of desired devices and is mounted inside a chip.

According to an embodiment, there is provided a monitoring circuit including: a sensor circuit including: a plurality of devices, and a selection circuit configured to select a device to be monitored among the plurality of devices; an input circuit configured to apply, based on input digital data, a first signal to the device to be monitored; and an output circuit configured to generate output digital data based on a second signal generated by the sensor circuit, wherein the input circuit includes a digital-to-analog converter configured to convert the input digital data into the first signal, and the output circuit includes an analog-to-digital converter.

According to an embodiment, there is provided an integrated circuit including: a monitoring circuit configured to monitor process characteristics of a device included in the integrated circuit; and a control circuit, wherein the monitoring circuit includes: a sensor circuit including: a plurality of devices, and a selection circuit configured to select a device to be monitored among the plurality of devices; an input circuit configured to apply, based on input digital data, a first signal to the device to be monitored; and an output circuit configured to generate output digital data based on a second signal generated by the sensor circuit, wherein the input circuit includes a digital-to-analog converter configured to convert the input digital data into the first signal, and the output circuit includes an analog-to-digital converter.

According to an embodiment, there is provided a process characteristics monitoring method performed by a monitoring circuit, the monitoring method including: selecting a device, among a plurality of devices, to be monitored; generating a first signal, which is an analog signal, based on input digital data; applying the first signal to the selected device to be monitored; and generating output digital data based on a second signal generated by the device to be monitored.

According to an embodiment, there is provided a monitoring circuit including: an input circuit including a digital-to-analog-converter configured to: convert a digital input into a first signal, and apply the first signal to a device to be monitored, among a plurality of devices arranged in an array; a current-to-voltage converter configured to: receive a second signal from the device to be monitored in response to the first signal, and convert the second signal into a voltage signal; and an output circuit including an analog-to-digital-converter configured to generate a digital output by converting the voltage signal into the digital output.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept are described in detail with reference to the accompanying drawings. The embodiments described herein are embodiment, and thus, the inventive concept is not limited thereto and may be realized in various other forms.

Figure 1:
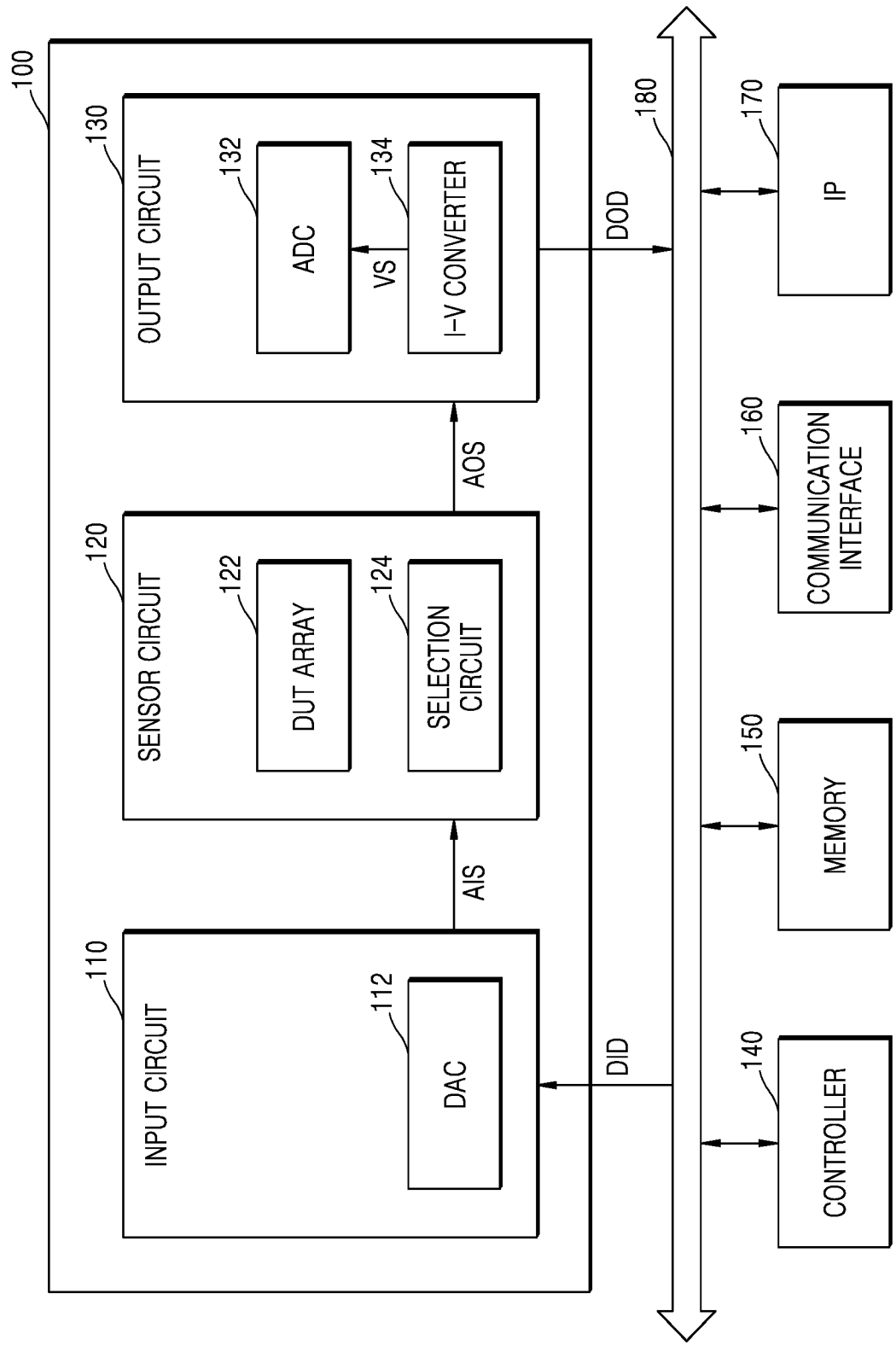
FIG. 1 is a diagram of an electronic system according to an embodiment.

FIG. 1 is a diagram of an electronic system 10 according to an embodiment.

Referring to FIG. 1, the electronic system 10 may include a monitoring circuit 100 including an input circuit 110, a sensor circuit 120, and an output circuit 130. In the embodiment, the monitoring circuit 100 is illustrated as including the sensor circuit 120, which is a monitoring object, but the monitoring circuit 100 and sensor circuit 120 may also be arranged discretely or separately in an integrated circuit. In addition, the electronic system 10 may further include a controller 140, a memory 150, a communication interface 160, and other general components such as a video component (for example, a camera interface, a joint photographic experts group (JPEG) processor, a video processor, a mixer, or the like), a graphics core, an audio system, a display driver, a graphics processing unit (GPU), and a digital signal processor (DSP). According to an embodiment, the electronic system 10 may further include various types of intellectual property (IP) blocks 170. According to an embodiment, the monitoring circuit 100, the controller 140, the memory 150, the communication interface 160, and the intellectual property (IP) blocks 170 may be connected to each other through a system bus 180.

The input circuit 110 may include a digital-to-analog converter (DAC) 112. The DAC 112 may be a device for converting a digital signal into an analog signal, and may convert input digital data IDD provided by the electronic system 10 into an input analog signal IAS and output the result. For example, the input analog signal IAS may be a first signal.

The sensor circuit 120 may include a device under test (DUT) array 122 and a selection circuit 124. The DUT array 122 may include a device array. In an embodiment, a DUT may be an arbitrary integrated circuit (IC) and/or a semiconductor element. The DUT array 122 may include a plurality of DUTs in an array form. The selection circuit 124 may include at least one multiplexer. The selection circuit 124 may select a DUT to be monitored by using the multiplexer. According to an embodiment, the DUT may be described by various expressions such as a device, a device to be monitored, and a DUT.

The sensor circuit 120 may apply the input analog signal IAS to a selected DUT, and generate an output analog signal AOS. For example, the input analog signal IAS may include a voltage signal applied to a gate terminal of a transistor, and the output analog signal AOS may include a current signal flowing through a drain terminal of a transistor.

The output circuit 130 may include an analog-to-digital converter (ADC) 132 and a current-to-voltage (I-V) converter 134. The I-V converter 134 may convert the output analog signal AOS, or a current signal, into an output voltage signal VS. The I-V converter 134 may further include a circuit for amplifying the output voltage signal VS to increase an accuracy of the ADC 132. The ADC 132 may convert the output voltage signal VS into output digital data DOD.

The controller 140 may control overall operations of the electronic system 10. As an example, the controller 140 may include a central processing unit (CPU). The controller 140 may include a single core or a multi-core. The controller 140 may process or execute stored programs and data. For example, the controller 140 may control the monitoring circuit 100 to perform a monitoring operation, and generate monitoring data, by executing programs stored in the memory 150.

The communication interface 160 may have various wired or wireless interfaces capable of communicating with an external device. The communication interface 160 may receive a learned target neural network from a server, and in addition, may receive a serve correspondence network generated by using a strengthened learning. The communication interface 160 may include a communication interface, or the like, connectable to a wireless local area network (WLAN) such as a wired local area network (LAN) and wireless fidelity (Wi-Fi), a wireless personal area network (WPAN) such as Bluetooth, wireless universal serial bus (USB), Zigbee, near field communication (NFC), radio-frequency identification (RFID), power line communication (PLC), or a mobile cellular network such as 3rd generation (3G), 4th generation (4G), and long term evolution (LTE).

The electronic system 10 may include various types of intellectual property (IP) blocks 170. For example, the IP blocks 170 may include a processing unit, a plurality of cores included in the processing unit, a multi-format codec (MFC), a video component (for example, a camera interface, a JPEG processor, a video processor, a mixer, or the like), a 3D graphics core, an audio system, a driver, a display driver, a volatile memory, a non-volatile memory, a memory controller, an input and output interface block, a cache memory, etc.

According to an embodiment, technologies for connecting the IP blocks 170 may include a connection method based on a system bus. For example, as a standard bus specification, an advanced microcontroller bus architecture (AMBA) protocol of Advanced RISC Machine (ARM), Ltd. may be applied. A bus type of the AMBA protocol may include advanced high-performance bus (AHB), advanced peripheral bus (APB), advanced extensible interface (AXI), AXI4, AXI coherency extensions (ACE), etc. Among the bus types described above, AXI may be an interface protocol between IP blocks, and may provide a multiple outstanding address function, a data interleaving function, etc. In addition, another protocol type such asuNetwork of SONICs Inc., CoreConnect of IBM, Inc., and open core protocol of OCP-IP may be applicable to a system bus.

Figure 2:
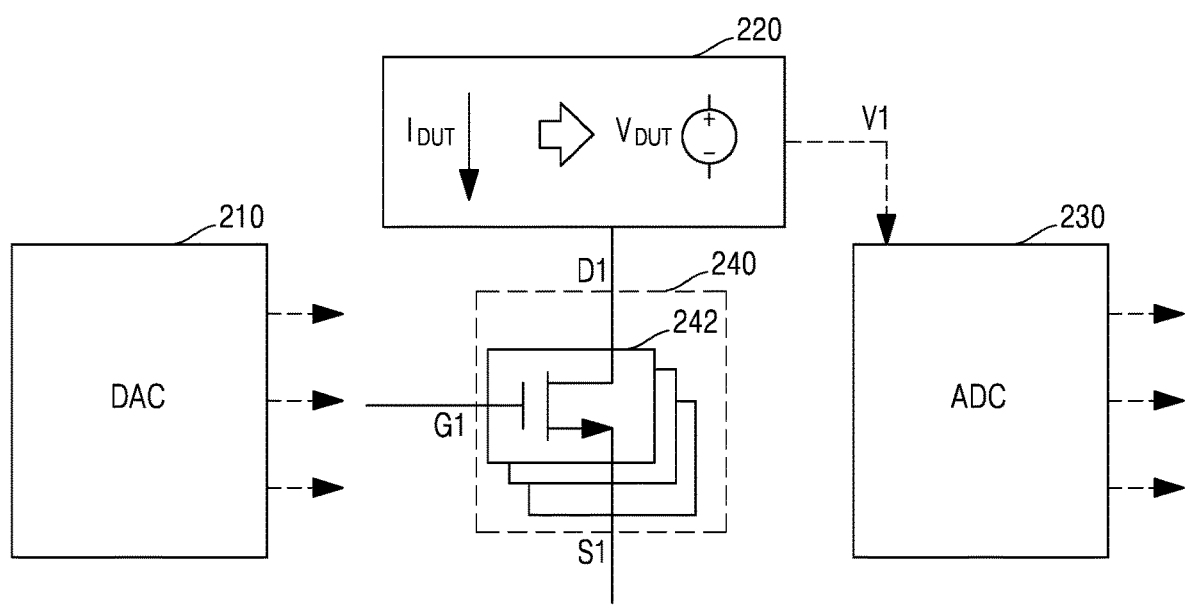
FIG. 2 is a diagram of a monitoring circuit according to an embodiment.

FIG. 2 is a diagram of a monitoring circuit 200 according to an embodiment.

Referring to FIG. 2, the monitoring circuit 200 may include a DAC 210, a sensor circuit 240, an I-V converter 220, and an ADC 230.

For example, the DAC 210 may generate a signal to be input to a gate terminal G1 of a transistor 242 included in the sensor circuit 240. The I-V converter 220 may generate a voltage V1 based on a current flowing through a drain terminal D1 of the transistor 242. The ADC 230 may generate a digital signal based on the voltage V1 generated by the I-V converter 220.

The sensor circuit 240 may include various types and sizes of devices for measuring process characteristics. For example, the sensor circuit 240 may include the transistor 242 for monitoring the process characteristics. The sensor circuit 240 may include a DUT array including a plurality of devices. The sensor circuit 240 may select a desired DUT from the DUT array, and apply a desired bias voltage.

Figure 3:
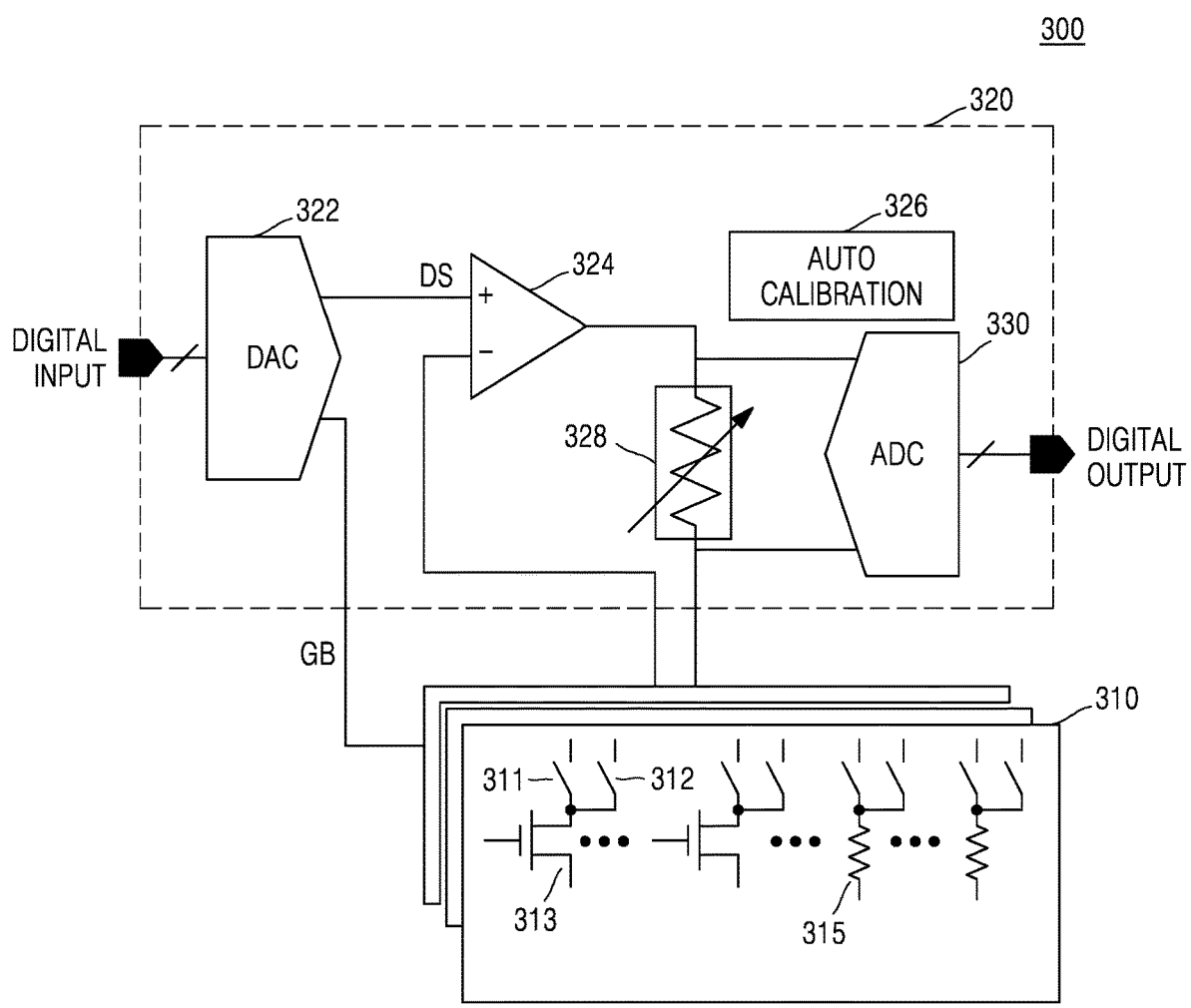
FIG. 3 is a diagram of a monitoring circuit according to an embodiment.

FIG. 3 is a diagram of a monitoring circuit 300 according to an embodiment.

In the case of a related art analog process analysis method, a pad may be arranged on each DUT, a bias voltage may be directly applied to the pad, and a result value may be measured by using the pad. In this case, statuses of various parameters may be accurately measured. However, because a plurality of pads are required for analyzing one device, it may be difficult to integrate many devices. Accordingly, in the case of using the related art analog process analysis method, because a peripheral area of a device or an independent space is required for device monitoring, an accurate characteristics identification of an actual product may be difficult.

According to an embodiment, the monitoring circuit 300 may include a DAC 322, an ADC 330, a feedback amplifier 324, and an I-V converter 328 for integrating them into a device. Moreover, the monitoring circuit 300 may use a method of, after receiving a digital signal, progressing an analysis, converting the result again into a digital value, and outputting the digital value. The monitoring circuit 300 may include a DUT array 310 and a main processor 320.

The monitoring circuit 300 may include the DUT array 310, which gathers various types and sizes of devices to be measured into one body. The DUT array 310 may include a first transistor 313 and a first resistor 315. A drain terminal of the first transistor 313 may be connected to a first switch 311 and a second switch 312 for compensating for a voltage error, and a detailed operation of voltage error compensation is described with reference to FIG. 5B.

The monitoring circuit 300 may select a DUT from the DUT array 310. The main processor 320 may include blocks for applying desired bias voltages and blocks for digitizing output information of the DUT. The monitoring circuit 300 may be configured to select and measure a plurality of DUTs by using one main processor 320 for increasing the number of DUTs capable of being measured in a small area and increasing types of parameters and analysis coverages.

The main processor 320 may receive a digital signal DS and select a DUT to be measured. The main processor 320 may include a DAC 322 for generating a desired bias voltage GB and an ADC 330 for converting information output by the DUT into a digital output. The main processor 320 may include a feedback amplifier 324 for applying an accurate voltage to the DUT and an I-V converter 328 for converting information in a current form flowing through the DUT so that the ADC 330 may recognize the result, and may further include an auto calibration circuit 326 for optimizing an accuracy of the analysis according to measurement conditions and environments.

Figure 4A:
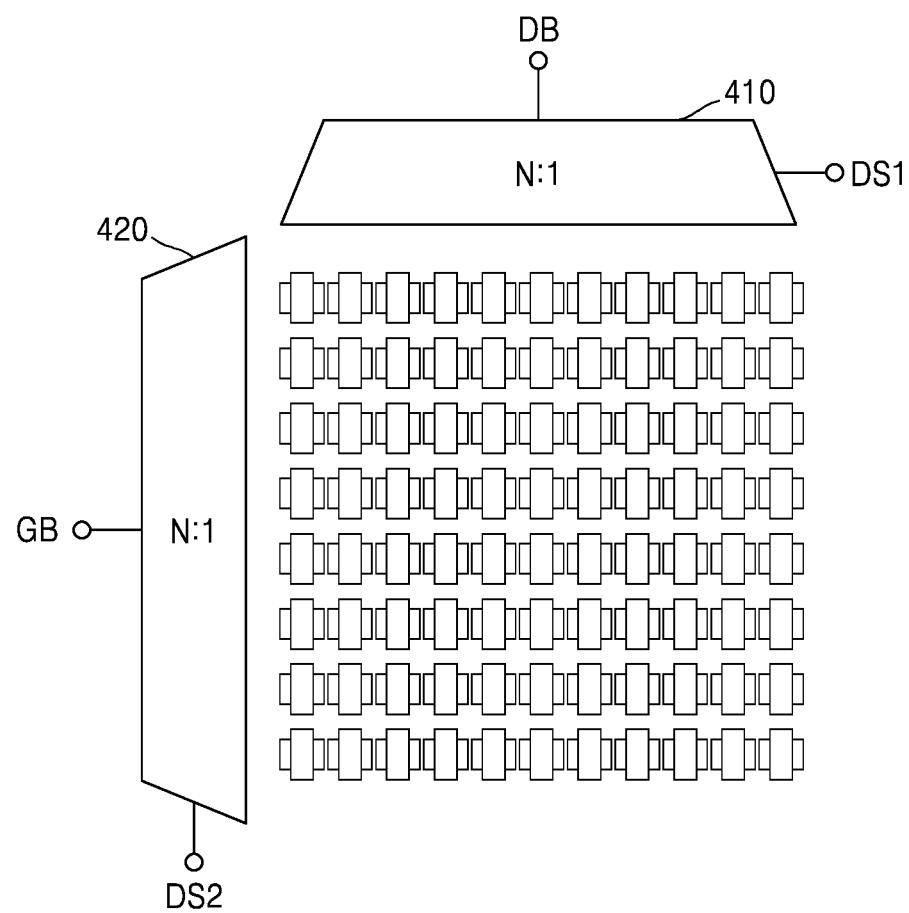
FIGS. 4A and 4B are diagrams of a device array in a monitoring circuit, according to embodiments.
Figure 4B:
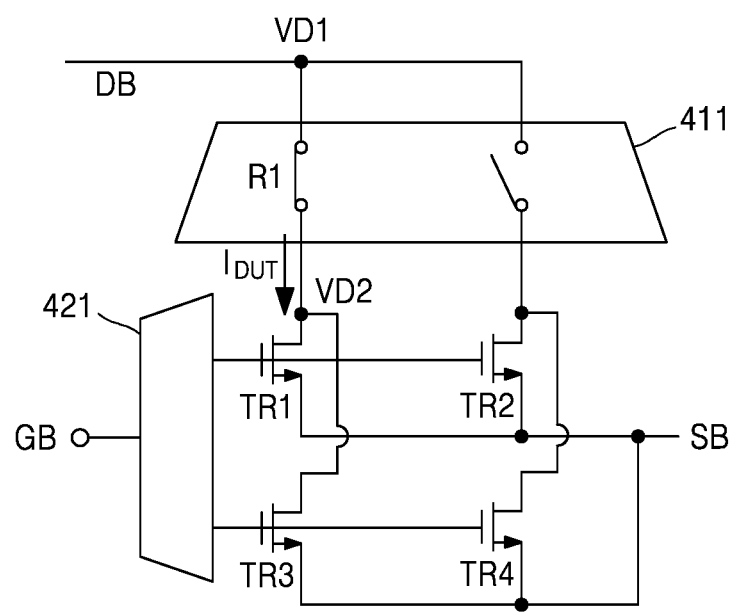

FIGS. 4A and 4B are diagrams of a device array in a monitoring circuit, according to embodiments.

Referring to FIGS. 4A and 4B, a plurality of devices in a monitoring circuit may be configured in a device array form. The monitoring circuit may arrange devices in an array form to increase the number of devices capable of being analyzed in a limited area, and may select and analyze by using a multiplexer.

For example, referring to FIG. 4A, the monitoring circuit may include a plurality of transistors arranged in an array form. The monitoring circuit may include a first multiplexer 410 for selecting a row of an array and a second multiplexer 420 for selecting a column of an array. The monitoring circuit may input the drain bias voltage DB to the first multiplexer 410, and select a row of an array by using a first device select signal DS1. The monitoring circuit may input a gate bias GB voltage to the second multiplexer 420, and select a column of an array by using a second device select signal DS2. Accordingly, the monitoring circuit may apply the drain bias voltage to the drain terminal of a selected transistor, and apply a gate bias voltage to a gate terminal of the select transistor.

Referring to FIG. 4B, a voltage decrease or a voltage increase may occur due to a resistance component of switches used in the multiplexers, i.e., first multiplexer 411 and second multiplexer 421. As a result, in the monitoring circuit, a final bias voltage applied to the device may have an error from an ideal value, and thus, an accuracy of the analysis result may be deteriorated. For example, in the monitoring circuit, when a first transistor TR1 is selected for monitoring, an analysis error may occur due to a resistance component R1 of a first switch included in a first multiplexer 411. The analysis error may be a value obtained by multiplying the resistance component R1 of the first switch by a current IDUT flowing in the drain of the first transistor TR1. In this case, the reliability of the analysis result of the monitoring circuit may be reduced, and a utilization range of the analysis result may be limited. A method of solving the analysis error is described with reference to FIGS. 5A and 5B.

Figure 5A:
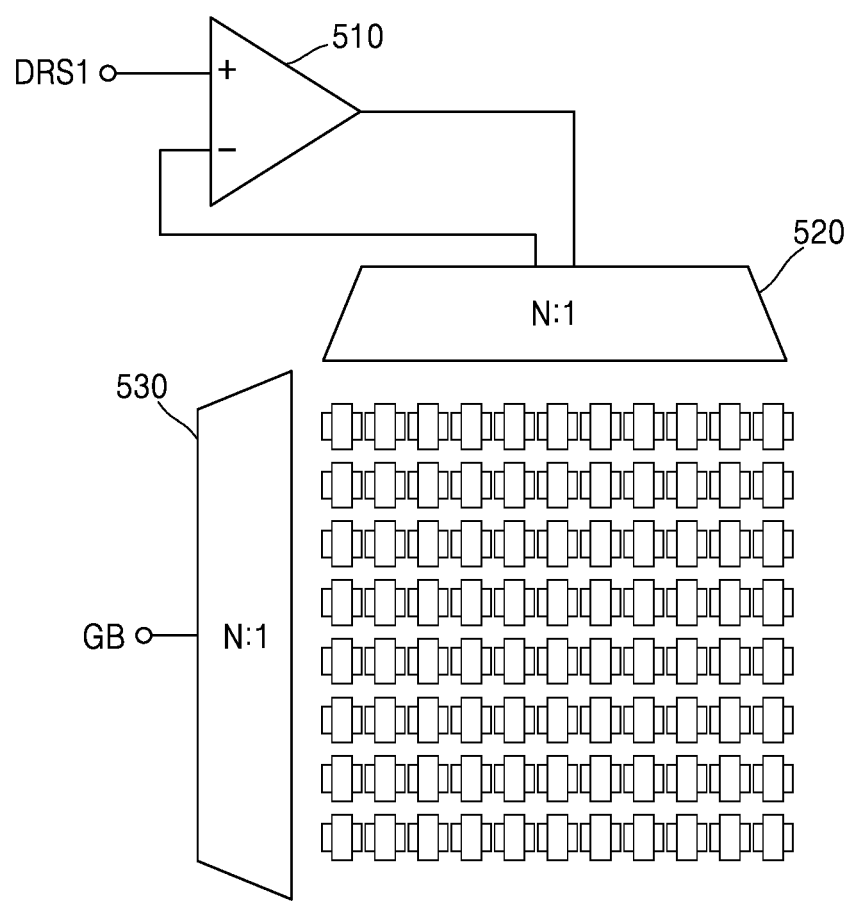
FIGS. 5A and 5B are diagrams of a device array in a monitoring circuit, according to embodiments.
Figure 5B:
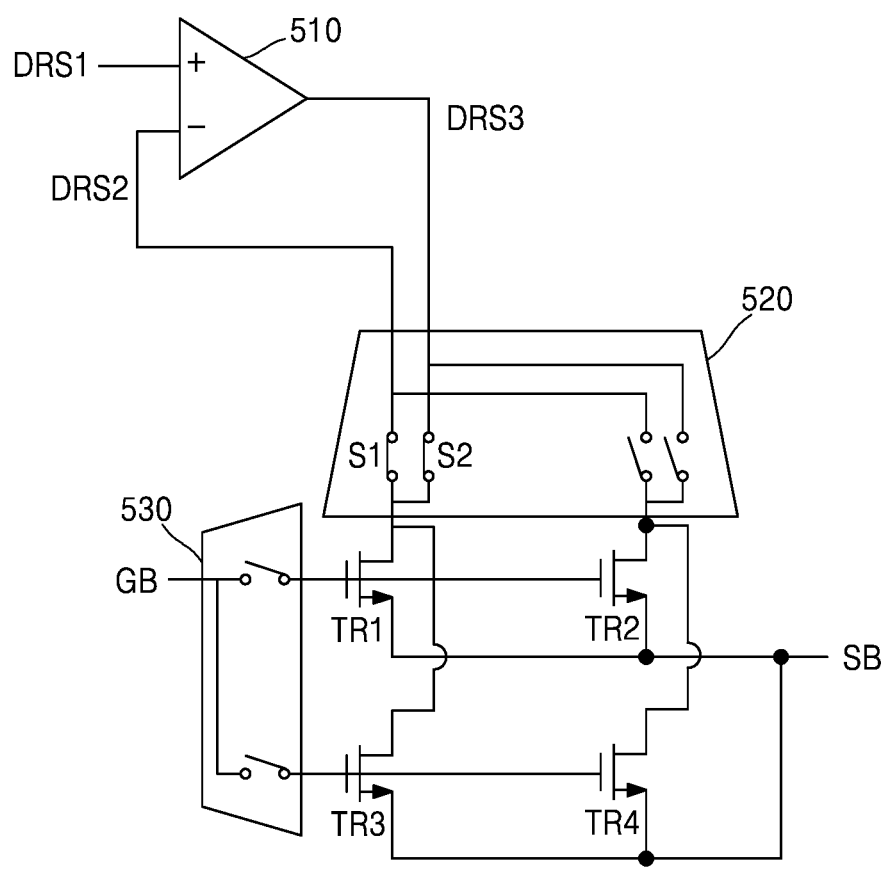

FIGS. 5A and 5B are diagrams of a device array in a monitoring circuit, according to embodiments.

Referring to FIGS. 5A and 5B, the monitoring circuit may further include a feedback amplifier 510 for solving a voltage decrease or increase error due to a resistance component of switches used in a multiplexer, i.e., a first multiplexer 520 and a second multiplexer 530.

The feedback amplifier 510 may set a voltage applied to a negative input terminal and an output terminal of the feedback amplifier 510, as an identical value to a voltage applied to a positive input terminal by using a feedback loop.

Referring to FIG. 5B, in the monitoring circuit, when the first transistor TR1 is selected, the first transistor TR1 may be connected to the feedback loop. A current generated by the first transistor TR1 of the monitoring circuit may flow in a direction toward an output terminal DRS3 of the feedback amplifier 510, and a current may not be generated in a direction of a negative input terminal DRS2. In this case, when the switch of the multiplexer is arranged in the feedback loop, a voltage identical to a voltage applied to a positive input terminal DRS1 may be applied to the first transistor TR1, regardless of resistance of a first switch 51 included in a path of the negative input terminal DRS2. Accordingly, the voltage decrease or increase error due to the resistance component of the switch included in the multiplexer may be removed.

Even when the feedback amplifier 510 is used, the voltage decrease or increase error may occur due to routing resistance, which is formed from the feedback loop to a device to be monitored. A method of solving this issue is described with reference to FIGS. 6A and 6B.

Figure 6A:
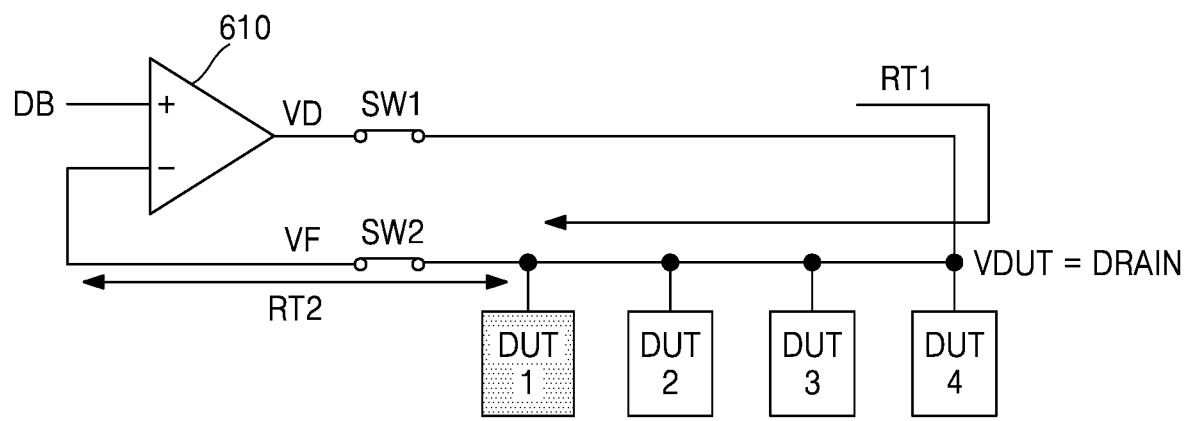
FIGS. 6A and 6B are diagrams of circuits for compensating for a voltage error in a monitoring circuit, according to embodiments.
Figure 6B:
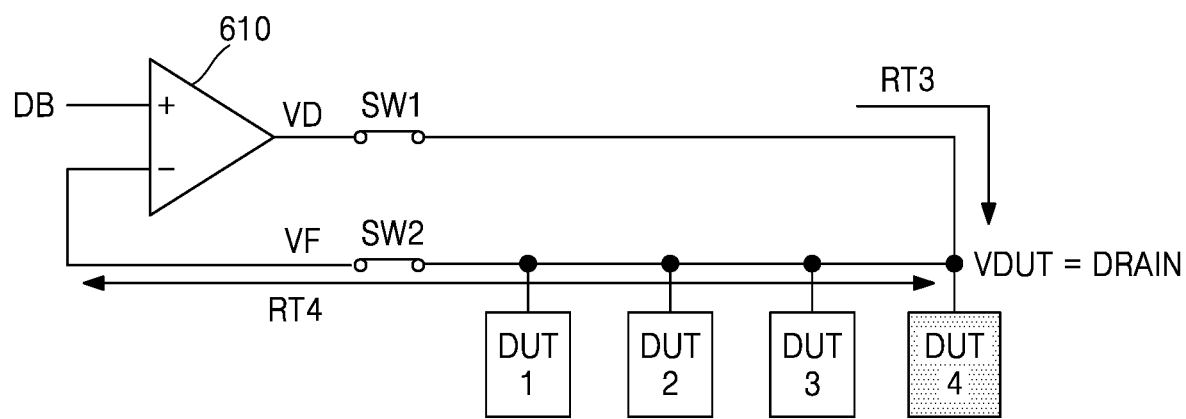

FIGS. 6A and 6B are diagrams of circuits for compensating for a voltage error in a monitoring circuit, according to embodiments.

The monitoring circuit may provide a voltage error compensation routing method for removing the voltage decrease or increase error due to the routing resistance formed from the feedback loop to the device to be monitored.

For example, referring to FIGS. 6A and 6B, a feedback amplifier 610 may be connected to a first device DUT1, a second device DUT2, a third device DUT3, or a fourth device DUT4. In this case, lengths of paths formed to respective devices may be different from each other, and the paths may include different resistance components from each other. Accordingly, in the monitoring circuit, a voltage decrease or increase error may occur due to the resistance component included in each path to the first device DUT1, the second device DUT2, the third device DUT3, or the fourth device DUT4. To solve this issue, the monitoring circuit may form a feedback loop at the farthest device location from the feedback amplifier 610 among devices included in the device array.

For example, the monitoring circuit may include the first device DUT1, the second device DUT2, the third device DUT3, and the fourth device DUT4, and form a feedback loop with the fourth device DUT4, which is farthest from the feedback amplifier 610, as a reference. Referring to FIG. 6A, when the monitoring circuit selects the first device DUT1, a drain current may flow through a first path RT1, which is formed from the output terminal of the feedback amplifier 610 to the first device DUT1. No current may flow through a second path RT2, which is formed from the negative input terminal of the feedback amplifier 610 to the first device DUT1. Accordingly, a supply voltage VF of the feedback amplifier 610 may be transferred to the first device DUT1 as is without a voltage loss.

Referring to FIG. 6B, when the monitoring circuit selects the fourth device DUT4, a drain current may flow through a third path RT3, which is formed from the output terminal of the feedback amplifier 610 to the fourth device DUT4. No current may flow through a fourth path RT4, which is formed from the negative input terminal of the feedback amplifier 610 to the fourth device DUT4. Thus, the supply voltage VF of the feedback amplifier 610 may be transferred to the fourth device DUT4 as is without a voltage loss.

Figure 7:
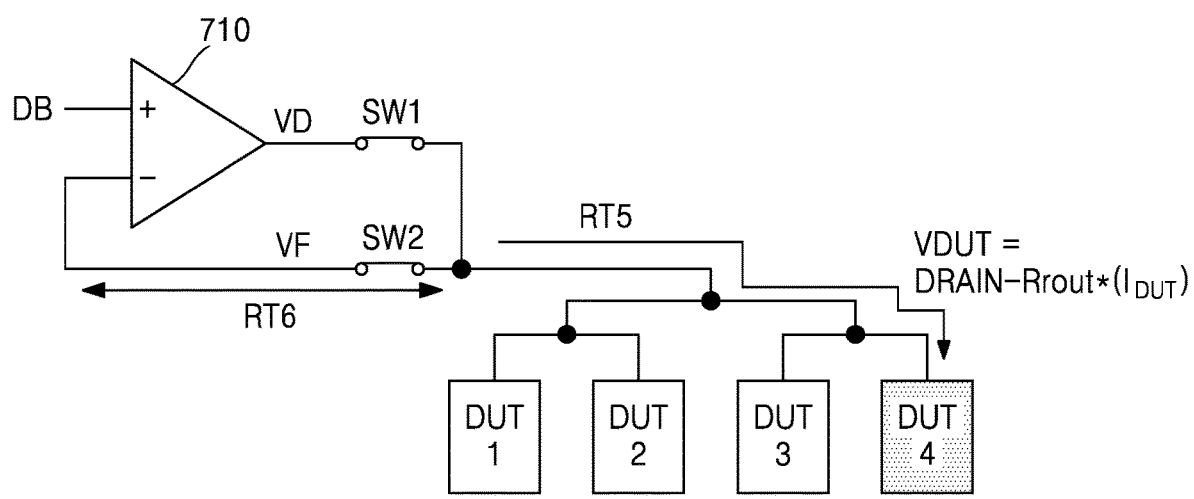
FIG. 7 is a diagram of a monitoring circuit according to an embodiment.

FIG. 7 is a diagram of a monitoring circuit according to an embodiment.

Referring to FIG. 7, a feedback amplifier 710 may be connected to the first device DUT1, the second device DUT2, the third device DUT3, and the fourth device DUT4. In this case, lengths of paths formed to respective devices may be different from each other, and each path may include a different resistance component. Accordingly, in the monitoring circuit, the voltage decrease or increase error due to the resistance component included in a path to the first device DUT1, the second device DUT2, the third device DUT3, or the fourth device DUT4 may occur. When the monitoring circuit selects the fourth device DUT4, a drain current may flow through a fifth path RT5, which is formed from the output terminal of the feedback amplifier 710 to the fourth device DUT4. A voltage loss may occur in the supply voltage VF of the feedback amplifier 710 due to resistance and the drain current, which are formed on a routing path.

Figure 8A:
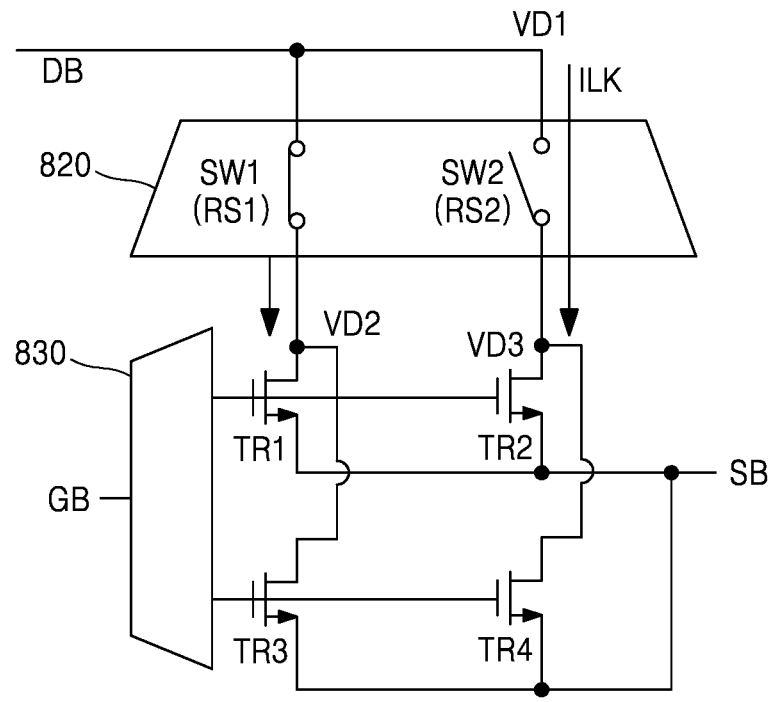
FIGS. 8A and 8B are diagrams of a circuit for compensating for an error due to a leakage current in a monitoring circuit, according to embodiments.
Figure 8B:
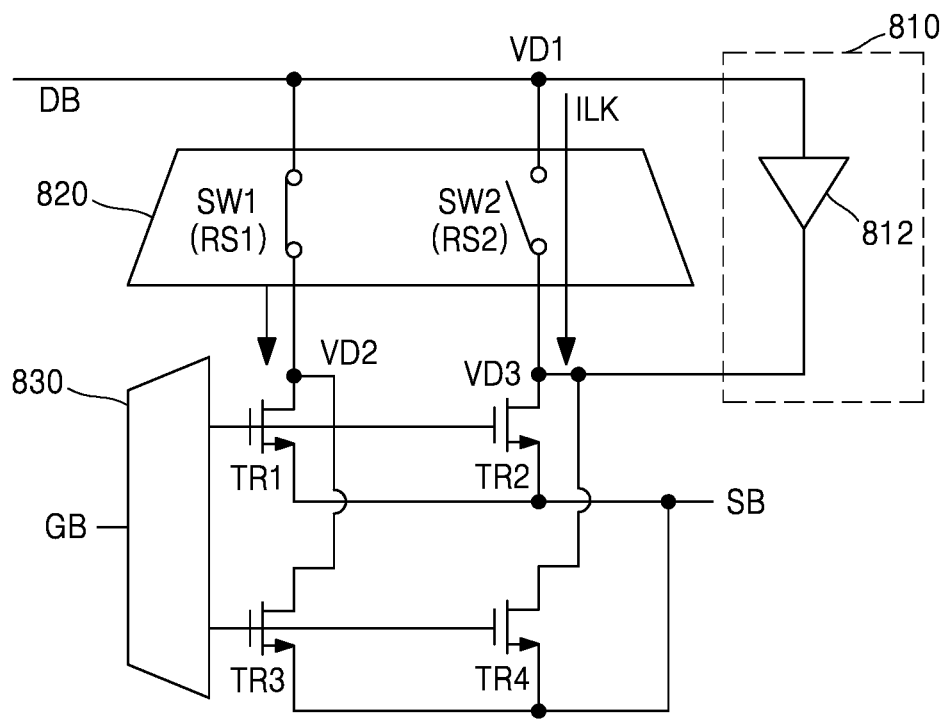

FIG. 8A is a comparison embodiment, and FIG. 8B is a diagram of a circuit for compensating for an error due to a leakage current in a monitoring circuit, which includes a first multiplexer 820 and a second multiplexer 830, according to an embodiment.

When the monitoring circuit selects the device to be monitored from the device array, a leakage current may occur in other unselected paths. Referring to FIG. 8A, when the first transistor TR1 is selected in the monitoring circuit using a first switch SW1, a leakage current ILK may occur in a path connected to a second transistor TR2, which is not selected via a second switch SW2. The leakage current ILK may be a value obtained by dividing a difference between a drain bias voltage VD1 and a voltage VD3 of a drain terminal of the second transistor TR2 by a resistance component RS2 at an off state of the second switch SW2. For example, the second switch SW2 may include a transistor. In the monitoring circuit, it may be difficult to accurately measure a current flowing through the first transistor TR1, which is actually to be measured, due to the leakage current ILK. According to an embodiment, a source bias SB may be applied.

Referring to FIG. 8B, the monitoring circuit may further include a leakage current prevention circuit 810. The leakage current prevention circuit 810 may include a buffer 812. In the monitoring circuit, also when the first transistor TR1 is selected, the leakage current prevention circuit 810 may be connected, in parallel, to a path connected to the second transistor TR2, which is not selected via the second switch SW2. The monitoring circuit may sense the drain bias voltage VD1 by using the leakage current prevention circuit 810, and transfer the sensed drain bias voltage VD1 to a drain terminal of the second transistor TR2. Accordingly, the monitoring circuit may remove a difference between the drain bias voltage VD1 and the voltage VD3 of the drain terminal of the second transistor TR2, and prevent the leakage current ILK. The monitoring circuit may more accurately measure characteristics of the device to be monitored in a device array structure by using the leakage current prevention circuit 810.

Figure 9:
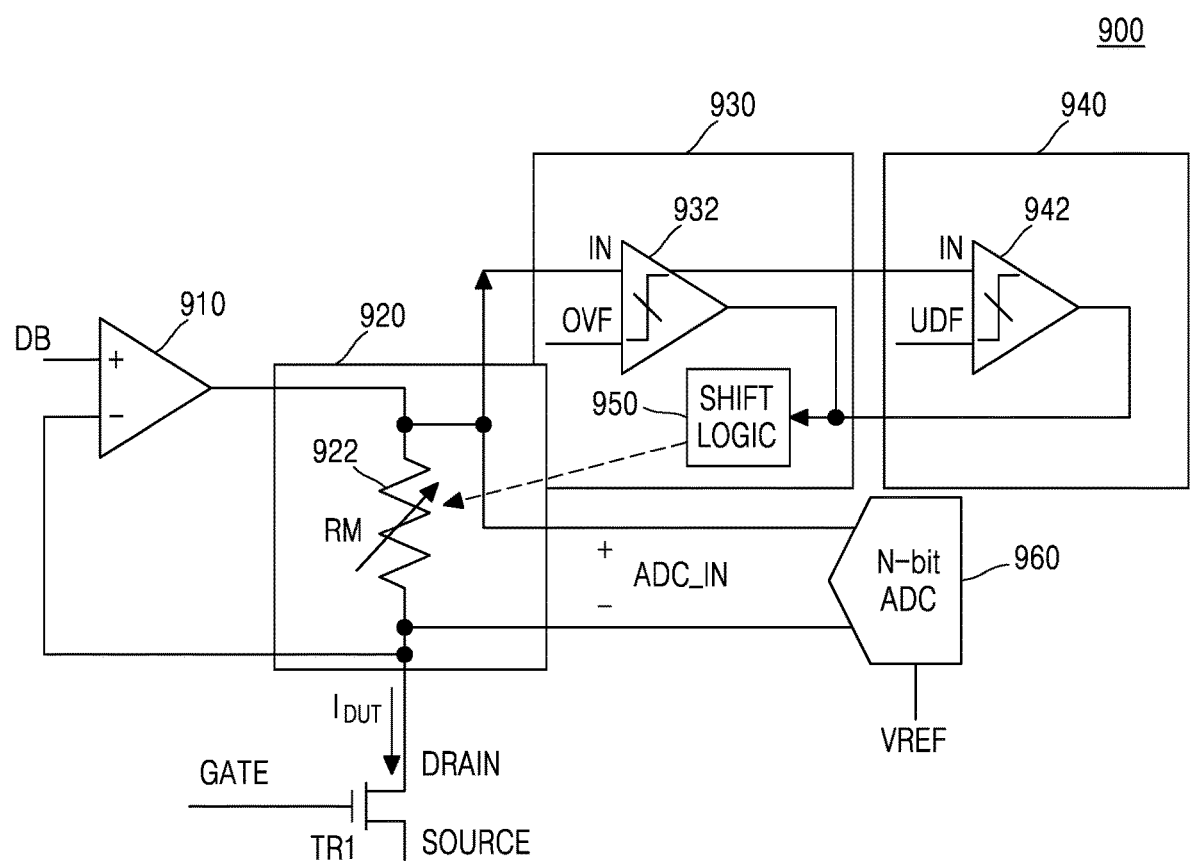
FIG. 9 is a diagram of a current-to-voltage converter in a monitoring circuit, according to an embodiment.

FIG. 9 is a diagram of an I-V converter 920 in a monitoring circuit 900, according to an embodiment.

Referring to FIG. 9, the monitoring circuit 900 may include a feedback amplifier 910, the I-V converter 920, a first auto calibration circuit 930, a second auto calibration circuit 940, and an N-bit ADC 960.

For example, the monitoring circuit 900 may apply a bias voltage required by the first transistor TR1, and convert the drain current IDUT flowing through the drain terminal of the first transistor TR1 into a voltage by using the I-V converter 920. The monitoring circuit 900 may convert a first voltage ADC Ind., which has been converted, into a digital signal by using the ADC 960.

The I-V converter 920 may include an internal resistor array for changing current information to voltage information. The drain current IDUT flowing through the drain terminal of the first transistor TR1 may be multiplied by a first resistor 922 to make the first voltage ADC_IN, and may be input to the ADC 960.

In this case, when a value of the first voltage ADC_IN, generated based on the drain current IDUT and the first resistor 922, is a large value, an effect of an error occurring in the ADC 960 may be decreased. Accordingly, the monitoring circuit 900 may control a magnitude of the first voltage ADC_IN to minimize the effect of the error occurring in the ADC 960. The monitoring circuit 900 may use a variable resistance RM by using the first resistor 922 for minimizing the magnitude of the first voltage ADC_IN.

In addition, the monitoring circuit 900 may include at least one of the first auto calibration circuit 930 and the second auto calibration circuit 940 for searching for an optimal resistance value to minimize an error of the ADC 960.

For example, the first auto calibration circuit 930 may operate when the device to be monitored includes an n-channel (N) metal-oxide-semiconductor (MOS) (NMOS) transistor. The first auto calibration circuit 930 may include a first comparator 932. The first auto calibration circuit 930 may further include a shift logic 950 for setting a resistance value of the first resistor 922 according to an operation result of the first comparator 932.

The first auto calibration circuit 930 may receive the first voltage ADC_IN as a first input IN of the first comparator 932, and receive a first reference value OVF as a second input of the first comparator 932. When the first voltage ADC_IN is less than the first reference value OVF, the first auto calibration circuit 930 may sequentially change the resistance value of the first resistor 922 by using the shift logic 950. When the first voltage ADC_IN becomes greater than the first reference value OVF, the first auto calibration circuit 930 may set a previous value obtained by the shift logic 950 as the resistance value of the first resistor 922.

For example, the second auto calibration circuit 940 may operate when the device to be monitored includes a p-channel (P) metal-oxide-semiconductor (MOS) (PMOS) transistor. The second auto calibration circuit 940 may include a second comparator 942. The second auto calibration circuit 940 may further include a shift logic 950 for setting the resistance value of the first resistor 922 according to an operation result of the second comparator 942. The first auto calibration circuit 930 and the second auto calibration circuit 940 may share the shift logic 950.

The second auto calibration circuit 940 may receive the first voltage ADC_IN as the first input IN of the second comparator 942, and receive a second reference value UDF as the second input of the first comparator 932. When the first voltage ADC_IN is less than the second reference value UDF, the second auto calibration circuit 940 may sequentially change the resistance value of the first resistor 922 by using the shift logic 950. When the first voltage ADC_IN is greater than the second reference value UDF, the second auto calibration circuit 940 may set a previous value obtained by the shift logic 950 as the resistance value of the first resistor 922.

Figure 10:
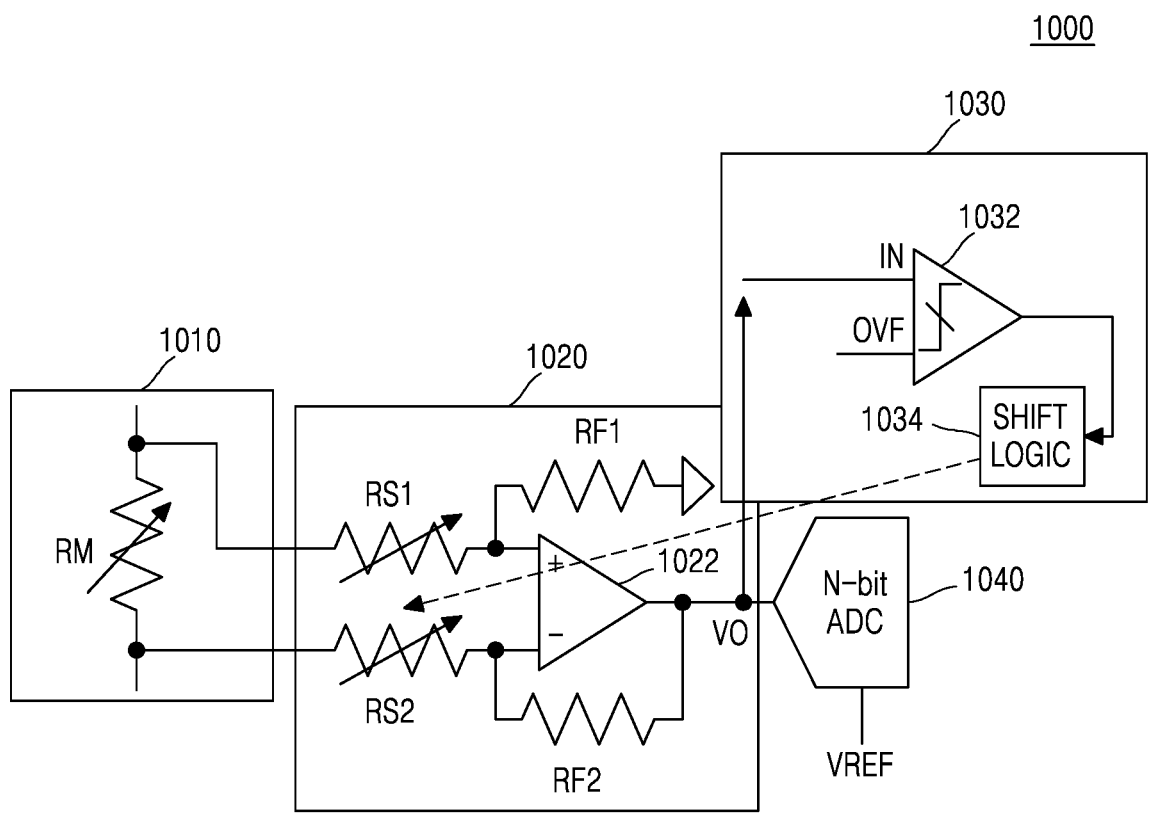
FIG. 10 is a diagram of a voltage amplification circuit in a monitoring circuit, according to an embodiment.

FIG. 10 is a diagram of a voltage amplification circuit in a monitoring circuit 1000, according to an embodiment.

Referring to FIG. 10, the monitoring circuit 1000 may include an I-V converter 1010, a gain amplification circuit 1020, a third auto calibration circuit 1030, an n-bit ADC 1040.

After current information passing through the device is converted into voltage information by using the I-V converter 1010, the monitoring circuit 1000 may use the gain amplification circuit 1020 for minimizing an error that occurs in the ADC 1040. The gain amplification circuit 1020 may include a programmable gain amplifier (PGA), and may amplify one more time the voltage information that has been converted by using the I-V converter 1010. In this case, a gain of the gain amplification circuit 1020 may be selected from x1 to x32 so that the voltage is converted to the largest voltage value in an operable range of an electronic system using the selected gain according to a magnitude of an output voltage of the I-V converter 1010.

The gain amplification circuit 1020 may include a first variable resistor RS1, a second variable resistor RS2, a third resistor RF1, a fourth resistor RF2, and a differential amplifier 1022. The gain amplification circuit 1020 may, for controlling the gain, change a value of the first variable resistor RS1 or the second variable resistor RS2 by using the third auto calibration circuit 1030.

The third auto calibration circuit 1030 may include a third comparator 1032. The third auto calibration circuit 1030 may further include a shift logic 1034 for setting a resistance value of the first variable resistor RS1 or the second variable resistor RS2 according to an operation result of the third comparator 1032.

The third auto calibration circuit 1030 may receive an output voltage VO of the gain amplification circuit 1020 as the first input IN of the third comparator 1032, and receive a third reference value OVF as the second input of the third comparator 1032. When the output voltage VO of the gain amplification circuit 1020 is less than the third reference value OVF, the third auto calibration circuit 1030 may sequentially change the resistance value of the first variable resistor RS1 or the second variable resistor RS2 by using the shift logic 1034. When the output voltage VO of the gain amplification circuit 1020 is greater than the third reference value OVF, the third auto calibration circuit 1030 may set a previous value obtained by the shift logic 1034 as the resistance value of the first variable resistor RS1 or the second variable resistor RS2.

Figure 11:
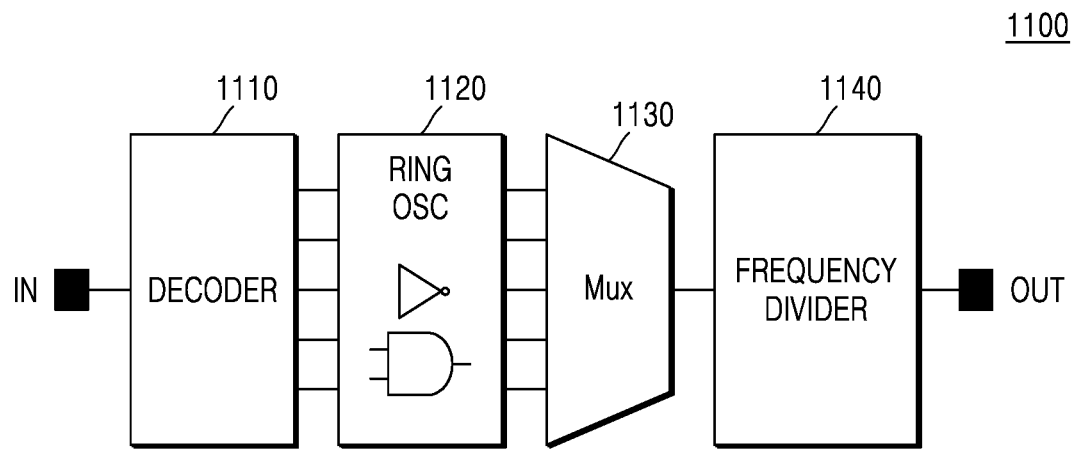
FIG. 11 is a diagram of a digital-type monitoring circuit based on a ring oscillator, according to an embodiment.

FIG. 11 is a diagram of a digital-type monitoring circuit 1100 based on a ring oscillator, according to an embodiment.

The digital-type monitoring circuit 1100 may include a decoder 1110, a ring oscillator 1120, a multiplexer 1130, and a frequency divider 1440.

The digital-type monitoring circuit 1100 may drive the ring oscillator 1120 including logics equipped with basic operation principles, identify a setup time or a hold time of a generated output, analyze whether the logics are targeted slow or fast, and estimate targeting of a process. The digital-type monitoring circuit 1100 may use an analysis method based on alternate current (AC) characteristics of the logic, and in the case of the AC characteristics, a result may be obtained by complex addition of parameter characteristics of devices. In addition, in the digital-type monitoring circuit 1100, the monitoring result may be affected by factors occurring due to an arrangement and connection of the logics in a process of configuring the ring oscillator.

According to an embodiment, when the monitoring circuit and the digital-type monitoring circuit 1100 are used in parallel, the parameters of the devices included in the integrated circuit may be more accurately monitored and analyzed.

Figure 12:
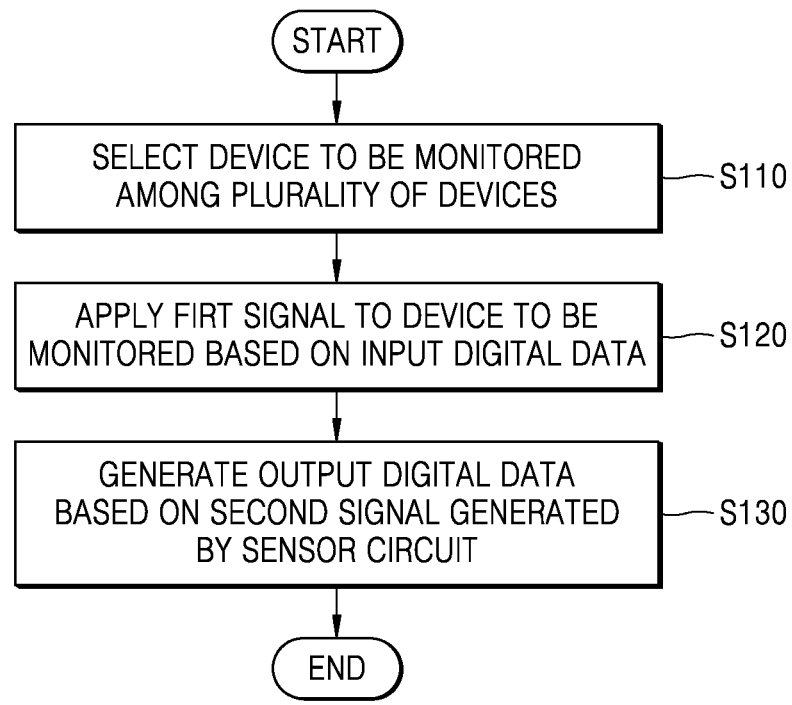
FIG. 12 is a flowchart of a monitoring method according to an embodiment.

FIG. 12 is a flowchart of a monitoring method according to an embodiment.

A monitoring circuit may select a device to be monitored among a plurality of devices (S110). In the monitoring circuit, the plurality of devices may be configured in a device array form. The monitoring circuit may arrange devices in an array form to increase the number of devices capable of being analyzed in a limited area, and may select and analyze by using a multiplexer. The plurality of devices may be arranged in an array form, and the selection circuit may include a first multiplexer for selecting rows of the array and a second multiplexer for selecting columns of the array.

The plurality of devices may include one of an NMOS transistor, a PMOS transistor, a resistor, and other various devices.

The monitoring circuit may apply, based on input digital data, the first signal to the device to be monitored (S120). The monitoring circuit may generate a signal to be input to a gate terminal of a transistor, which is the device to be monitored, by using a DAC.

The monitoring circuit may further include a feedback amplifier for solving a voltage decrease or increase error due to resistance components of switches used in the multiplexer. The feedback amplifier may set a voltage, applied to a negative input terminal and an output terminal of the feedback amplifier, the same as a voltage applied to a positive input terminal by using the feedback loop. For example, in the monitoring circuit, when a first transistor is selected, the first transistor may be connected to the feedback loop. A current occurring in the first transistor of the monitoring circuit may flow in a direction of the output terminal of the feedback amplifier, and a current may not occur in a direction of the negative input terminal. In this case, when a switch of the multiplexer is arranged in the feedback loop, a voltage identical to a voltage applied to a positive input terminal may be applied to the first transistor regardless of resistance of a first switch included in a path of the negative input terminal. Accordingly, the voltage decrease or increase error due to a resistance component of the switch included in the multiplexer may be removed.

The monitoring circuit may provide a voltage error compensation routing method for removing the voltage decrease or increase error due to a routing resistance formed from the feedback loop to the device to be monitored.

The monitoring circuit may further include a leakage current prevention circuit. The leakage current prevention circuit may include a buffer. In the monitoring circuit, also when the first transistor is selected, the leakage current prevention circuit may be connected, in parallel, to a path connected to the second transistor, which is not selected via the second switch. The monitoring circuit may sense a drain bias voltage by using the leakage current prevention circuit, and transfer the sensed drain bias voltage to a drain terminal of the second transistor. Accordingly, the monitoring circuit may remove a difference between the drain bias voltage and the voltage of the drain terminal of the second transistor. The monitoring circuit may more accurately measure characteristics of the device to be monitored in a device array structure by using the leakage current prevention circuit.

The monitoring circuit may generate output digital data based on the second signal generated by a sensor circuit (S130).

For example, the monitoring circuit may apply a desired bias voltage to the first transistor, and may convert a drain current flowing through the drain terminal of the first transistor into a voltage by using the I-V converter. The monitoring circuit may convert a converted first voltage into a digital signal by using the ADC. In addition, the monitoring circuit may include an auto calibration circuit for searching for an optimal resistance value to minimize an error of the ADC.

The auto calibration circuit may include a comparator. The auto calibration circuit may further include a shift logic for setting a resistance value of a variable resistor included in the I-V converter according to an operation result of the comparator.

After current information passing through a device is converted into voltage information by using the I-V converter, the monitoring circuit may use a gain amplification circuit for additionally amplifying a voltage to minimize an error, which occurs in the ADC.

The monitoring circuit further comprises a control circuit configured to store monitoring result data of the plurality of devices, based on the output digital data. The control circuit compensate a supply voltage or a supply voltage or a supply frequency based on the monitoring result data.

Figure 13:
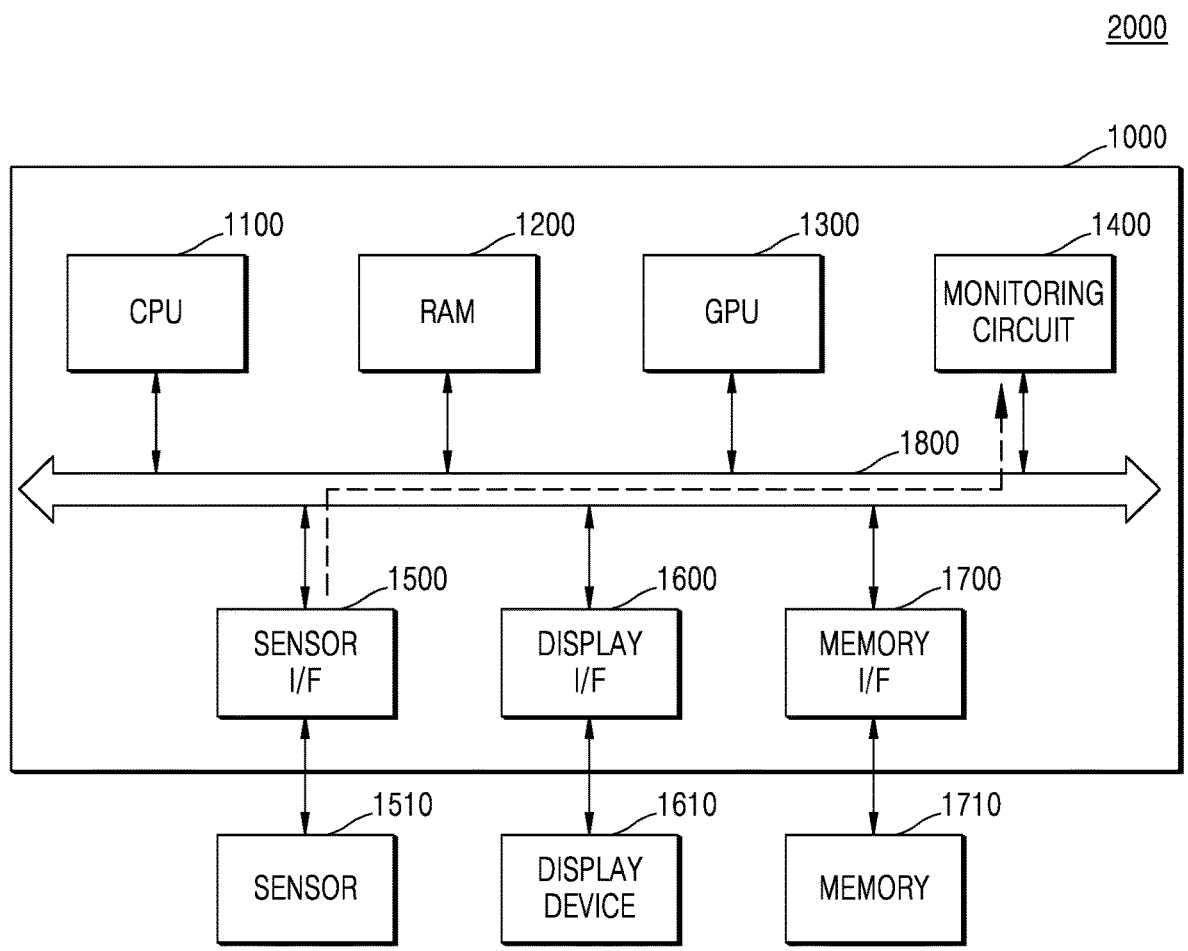
FIG. 13 is a block diagram of an integrated circuit and a device including the integrated circuit, according to an embodiment.

FIG. 13 is a block diagram of an integrated circuit 1000 and a device 2000 including the same, according to an embodiment.

The device 2000 may include the integrated circuit 1000 and components connected to the integrated circuit 1000, for example, a sensor 1510, a display device 1610, and a memory 1710. The device 2000 may include a device including a monitoring circuit. For example, the device 2000 may include a mobile device such as a smartphone, a game device, and a wearable device.

The integrated circuit 1000 according to an embodiment may include a CPU 1100, random access memory (RAM) 1200, a GPU 1300, a monitoring circuit 1400, a sensor interface (I/F) 1500, a display I/F 1600, and a memory I/F 1700. In addition, the integrated circuit 1000 may further include other general purpose components such as a communication interface, a DSP, and a video component, and components of the integrated circuit 1000 (the CPU 1100, RAM 1200, the GPU 1300, the monitoring circuit 1400, the sensor I/F 1500, the display I/F 1600, and the memory I/F 1700) may transceive data to and from each other via a bus 1800. In an embodiment, the integrated circuit 1000 may include an application processor. In an embodiment, the integrated circuit 1000 may be implemented as a system on chip (SoC).

The CPU 1100 may control an overall operation of the integrated circuit 1000. The CPU 1100 may include one processor core (or a single core) or a plurality of processor cores (or a multi-core). The CPU 1100 may process or execute programs and/or data stored in the memory 1710. In an embodiment, the CPU 1100 may control a function of a monitoring circuit 1400, by executing programs stored in the memory 1710.

The RAM 1200 may temporarily store programs, data, or instructions. According to an embodiment, the RAM 1200 may be implemented as dynamic RAM (DRAM) or static RAM (SRAM). The RAM 1200 may temporarily store data that is input/output via the sensor I/F 1500 and the display I/F 1600, or generated by the GPU 1300 or the CPU 1100, for example, image data.

In an embodiment, the integrated circuit 1000 may further include read-only memory (ROM). The ROM may store programs and/or data to be continuously used. The ROM may be implemented as erasable and programmable ROM (EPROM), electrically erasable and programmable ROM (EEPROM), etc.

The GPU 1300 may perform an image processing of the image data. For example, the GPU 1300 may perform the image processing on the image data received via the sensor IF 1500. The image data processed by the GPU 1300 may be stored in the memory 1710, or may be provided to the display device 1610 via the display I/F 1600. The image data stored in the memory 1710 may be provided to the monitoring circuit 1400.

The sensor I/F 1500 may interface with data input by the sensor 1510 connected to the integrated circuit 1000 (for example, the image data, audio data, etc.).

The display I/F 1600 may interface with data output to the display device 1610 (for example, an image). The display device 1610 may output the image or the image data via a display such as liquid crystal display (LCD) and active matrix organic light emitting diode (AMOLED) display.

The memory I/F 1700 may interface with data input by the memory 1710 outside the integrated circuit 1000, or data output to the memory 1710. According to an embodiment, the memory 1710 may be implemented as a volatile memory such as DRAM and SRAM, or a non-volatile memory such as Resistive RAM (ReRAM), Phase change RAM (PRAM) and NAND flash memory. The memory 1710 may also be implemented as a memory card (a multi-media card (MMC), an embedded MMC (eMMC), a secure digital (SD) card, or a micro SD card, etc.).

The monitoring circuit 100 described with reference to FIG. 1 may be applied as the monitoring circuit 1400. The monitoring circuit 1400 may include a DAC, an ADC, an I-V converter, and a DUT, and monitor various characteristics of the integrated circuit 1000. Accordingly, monitoring data processing convenience and accuracy of the device 2000 or the integrated circuit 1000 included in the device 2000 may be increased.

The device according to the embodiments may include a processor, a memory for storing and executing program data, a permanent storage unit such as a disk drive, a communication port for communicating with external devices, and a user interface device such as a touch panel, a key, and a button. Methods implemented as a software module or an algorithm may be stored as computer-readable code or program instructions executable on a processor on a computer-readable recording medium. In this case, the computer-readable recording medium may include a magnetic storage medium (for example, ROM, RAM, a floppy disk, a hard disk, or the like), an optical reading medium (for example, a CD-ROM and a digital versatile disc (DVD)), etc. The computer-readable recording medium may be distributed to computer systems connected to each other in a network, and may be stored and executed in a distribution manner. A medium may be read by a computer, stored in a memory, and executed by a processor.

The embodiment may be described in terms of functional block components and various processing steps. The functional blocks may be implemented as various number of hardware and/or software components configured to perform particular functions. For example, the embodiment may employ various IC components such as a memory, a processor, a logic, and a look-up table, which are capable of performing various functions under the control of one or more microprocessors or other control devices. Similarly to the case where the components are executed by using software programming or software elements, the embodiment may include various algorithms implemented as a data structure, processes, routines or a combination of other programming elements, and may be implemented as a programming or scripting language such as C, C++, Java, and assembler. Functional aspects may be implemented as an algorithm executed by one or more processors. In addition, the embodiment may employ conventional techniques for electronic environment setting, signal processing, and/or data processing, etc.

While the inventive concept has been particularly shown and described with reference to embodiments thereof, it will be understood that various changes in form and details may be made therein without departing from the spirit and scope of the following claims.

What is claimed is:

1. A monitoring circuit comprising:
a sensor circuit comprising:
a plurality of devices, and
a selection circuit configured to select a first device to be monitored among the plurality of devices;
an input circuit configured to apply, based on input digital data, a first signal to the first device to be monitored; and
an output circuit configured to generate output digital data based on a second signal generated by the sensor circuit,
wherein the input circuit comprises a digital-to-analog converter configured to convert the input digital data into the first signal, and the output circuit comprises an analog-to-digital converter,
wherein the selection circuit comprises a feedback amplifier comprising a first input terminal, a second input terminal, and an output terminal,
wherein the first input terminal of the feedback amplifier is configured to receive a select signal for selecting the first device among the plurality of devices, and
wherein the second input terminal of the feedback amplifier and the output terminal of the feedback amplifier are connected to the first device through a first switch and a second switch of a first multiplexer in parallel.

2. The monitoring circuit of claim 1, wherein the plurality of devices comprise at least one of an n-channel metal-oxide-semiconductor (NMOS) transistor, a p-channel metal-oxide-semiconductor (PMOS) transistor, or a resistor.

3. The monitoring circuit of claim 1, wherein the plurality of devices are arranged in an array form, and
wherein the selection circuit comprises the first multiplexer configured to select one or more rows of the array and a second multiplexer configured to select one or more columns of the array.

4. The monitoring circuit of claim 3, wherein the feedback amplifier is configured to compensate for noise of a voltage signal, and
wherein the second input terminal of the feedback amplifier and the output terminal of the feedback amplifier are connected to each of the plurality of devices in parallel.

5. The monitoring circuit of claim 4, wherein the plurality of devices comprise transistors, and
wherein the second input terminal of the feedback amplifier and the output terminal of the feedback amplifier are connected to drain terminals of the transistors in parallel.

6. The monitoring circuit of claim 4, wherein a device farthest from the feedback amplifier among the plurality of devices is connected to the output terminal of the feedback amplifier to form a feedback loop.

7. The monitoring circuit of claim 1, wherein the second signal comprises a current signal, and
wherein the output circuit further comprises a current-to-voltage converter configured to convert the second signal into a voltage signal.

8. The monitoring circuit of claim 7, wherein the current-to-voltage converter further comprises a first variable resistor configured to amplify a magnitude of the voltage signal.

9. The monitoring circuit of claim 8, further comprising a first comparator configured to output a variable resistance set signal based on the voltage signal and a first reference voltage as inputs.

10. The monitoring circuit of claim 9, further comprising a gain amplification circuit configured to amplify the voltage signal,
wherein the gain amplification circuit further comprises a second comparator and a second variable resistor configured to set the voltage signal as a second reference voltage.

11. The monitoring circuit of claim 1, wherein the selection circuit further comprises a leakage current prevention circuit on a path of an unselected device,
wherein the leakage current prevention circuit transfers a voltage level of one end of a selected device, which is connected to the selection circuit, to one end of an unselected device, which is connected to the selection circuit.

12. The monitoring circuit of claim 1, further comprising a control circuit configured to store monitoring result data of the plurality of devices, based on the output digital data.

13. The monitoring circuit of claim 12, wherein the control circuit configured to compensate a supply voltage or a supply frequency, based on the monitoring result data.

14. The monitoring circuit of claim 1, further comprising a sub-monitoring circuit comprising a ring oscillator configured to monitor frequency performance of the plurality of devices.

15. An integrated circuit comprising:
a monitoring circuit configured to monitor process characteristics of a device comprised in the integrated circuit; and
a control circuit,
wherein the monitoring circuit comprises:
a sensor circuit comprising:
a plurality of devices, and
a selection circuit configured to select a first device to be monitored among the plurality of devices;
an input circuit configured to apply, based on input digital data, a first signal to the first device to be monitored; and
an output circuit configured to generate output digital data based on a second signal generated by the sensor circuit,
wherein the input circuit comprises a digital-to-analog converter configured to convert the input digital data into the first signal, and the output circuit comprises an analog-to-digital converter,
wherein the selection circuit comprises a feedback amplifier comprising a first input terminal, a second input terminal, and an output terminal,
wherein the first input terminal of the feedback amplifier is configured to receive a select signal for selecting the first device among the plurality of devices, and
wherein the second input terminal of the feedback amplifier and the output terminal of the feedback amplifier are connected to the first device through a first switch and a second switch of a first multiplexer in parallel.

16. The integrated circuit of claim 15, wherein the control circuit is configured to store monitoring result data of the plurality of devices, based on the output digital data.

17. A monitoring circuit comprising:
an input circuit comprising a digital-to-analog-converter configured to:
convert a digital input into a first signal, and
apply the first signal to a first device to be monitored, among a plurality of devices arranged in an array;
a current-to-voltage converter configured to:
receive a second signal from the first device to be monitored in response to the first signal, and
convert the second signal into a voltage signal;
an output circuit comprising an analog-to-digital-converter configured to generate a digital output by converting the voltage signal into the digital output; and
a feedback amplifier comprising a first input terminal, a second input terminal, and an output terminal,
wherein the first input terminal of the feedback amplifier is configured to receive a select signal for selecting the first device, and
wherein the second input terminal of the feedback amplifier and the output terminal of the feedback amplifier are connected to the first device through a first switch and a second switch of a first multiplexer in parallel.

18. The monitoring circuit of claim 17, further comprising:
the first multiplexer configured to select one or more rows of the array, and
a second multiplexer configured to select one or more columns of the array.

19. The monitoring circuit of claim 17, further comprising:
the feedback amplifier is configured to compensate for noise of the voltage signal.

20. The monitoring circuit of claim 19, wherein
the second input terminal and the output terminal are connected to each of the plurality of devices in parallel.

* * * * *